United States Patent
Tiebout et al.

(12) 
(10) Patent No.: US 7,835,121 B2
(45) Date of Patent: Nov. 16, 2010

(54) SEMICONDUCTOR DEVICE WITH ESD PROTECTION

(75) Inventors: Marc Tiebout, Finkenstein (AT); Koen Mertens, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/741,469

(22) Filed: Apr. 27, 2007

(65) Prior Publication Data

US 2007/0253128 A1 Nov. 1, 2007

(30) Foreign Application Priority Data

Apr. 28, 2006 (DE) .................... 10 2006 019 888

(51) Int. Cl.
  *H02H 9/00* (2006.01)
(52) U.S. Cl. .................... 361/56; 361/91.1; 361/111
(58) Field of Classification Search ............ 361/56, 361/111
  See application file for complete search history.

(56) References Cited

U.S. PATENT DOCUMENTS 5,477,198 A * 12/1995 Anderson et al. ....... 331/177 R
2002/0180001 A1 * 12/2002 Woo et al. .................... 257/546
2005/0224883 A1 * 10/2005 Huang et al. ................. 257/355
2006/0065932 A1 * 3/2006 Huang et al. ................. 257/355
2007/0133137 A1 * 6/2007 Dornbusch .................... 361/56

FOREIGN PATENT DOCUMENTS

JP      03011809      1/1991

OTHER PUBLICATIONS

Paul Horowitz, The Art of Electronics, 2006, The Press Syndicate of the University of Cambridge, Second Edition, 86-87, 165-166.*

* cited by examiner

*Primary Examiner*—Stephen W Jackson
*Assistant Examiner*—Tien Mai
(74) *Attorney, Agent, or Firm*—Dicke, Billig & Czaja, PLLC

(57) ABSTRACT

Semiconductor device having an amplifier. In one embodiment, the amplifier includes a first amplifier path including a first input and a second amplifier path including a second input. An inductance having a connectable node is connected between the first and second inputs, the connectable node being symmetrically connected between the first and second inputs. At least one ESD protection structure is connected to the connectable node. In one embodiment, the semiconductor device is used in a communications device.

21 Claims, 5 Drawing Sheets

US 7,835,121 B2

SEMICONDUCTOR DEVICE WITH ESD PROTECTION

CROSS-REFERENCE TO RELATED APPLICATIONS

This Utility Patent Application claims priority to German Patent Application No. DE 10 2006 019 888.3 filed on Apr. 28, 2006, which is incorporated herein by reference.

BACKGROUND

For wireless applications, for instance radar applications in the frequency range of 24 or 77 GHz or telecommunications applications such as WLAN (Wireless Local Area Network) with frequencies and frequency bands in the range of 2.4 GHz, 5 GHz and 17 GHz or else UWB (Ultra Wide Band) applications, it is possible to observe development trends toward large-scale integration of complete transceivers or single-chip systems using CMOS (Complementary Metal Oxide Semiconductor) technology. Such large-scale-integrated systems have an LNA (Low Noise Amplifier) with low-noise gain, on which demands for input impedance, gain, linearity and ESD (Electrostatic Discharge) protection are imposed for applications at the highest frequencies in the range of approximately 1 to 77 GHz and higher. Special demands are imposed on ESD protection structures in radio-frequency (RF) applications since the ESD protection structures are not supposed to result in any losses in the functionality of the radio-frequency applications.

An amplifier, for example an LNA, which has an improved performance would be desirable.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
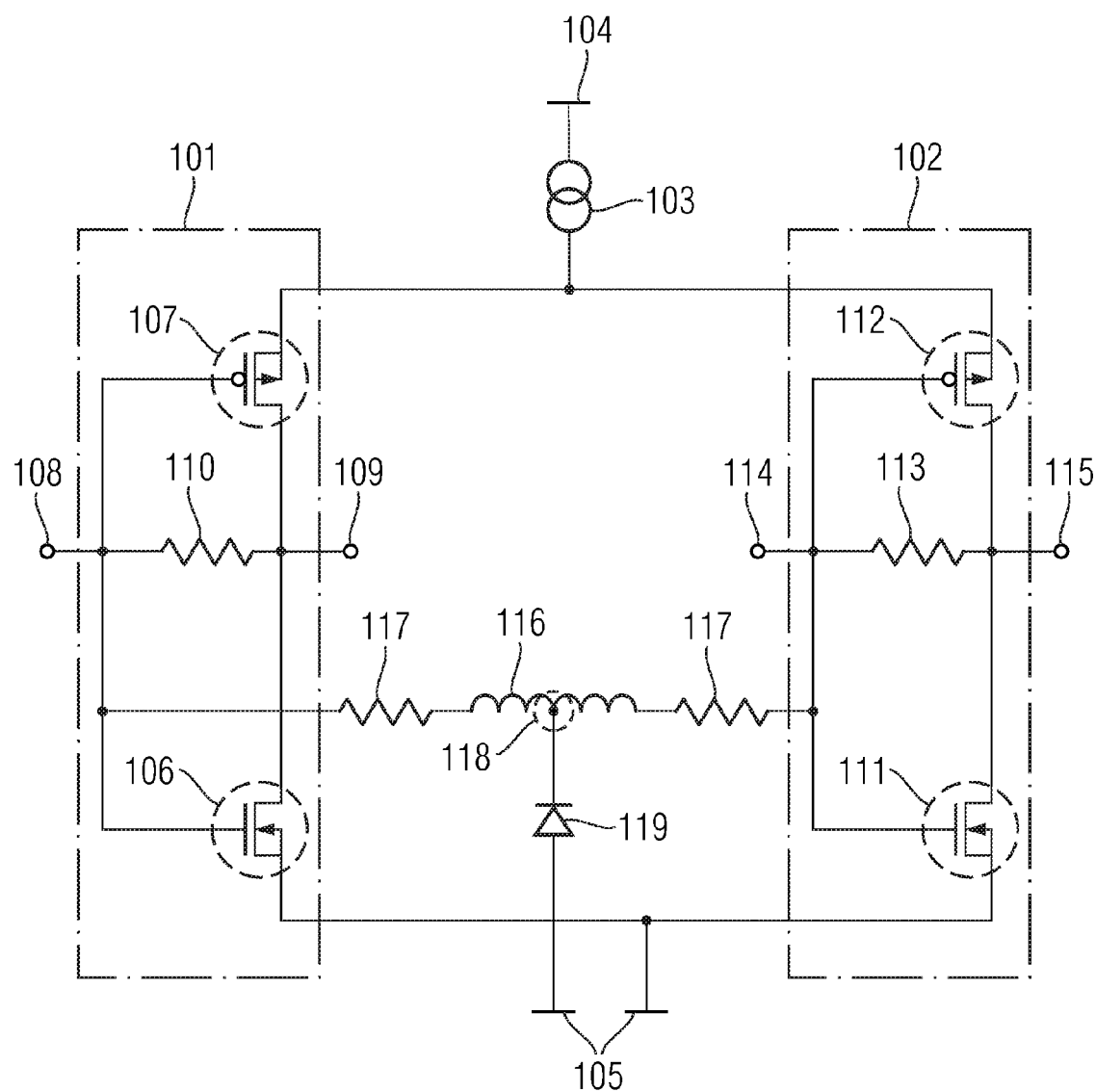
FIG. 1 illustrates a schematic equivalent circuit diagram of an amplifier with ESD protection according to a first embodiment of the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a communications device or system. One embodiment provides a semiconductor device having an amplifier including a first amplifier path with a first input and a first output, a second amplifier path with a second input and a second output, at least one inductance which is connected between the first and second inputs as well as a connectable node, the connectable node being symmetrically arranged between the first and second inputs in relation to the at least one inductance, and at least one ESD protection structure which is connected to the connectable node.

The connectable node is thus at AC (Alternating Current) ground, that is to say it does not change its potential in the event of an AC voltage signal difference being dropped across the two inputs, with the result that a capacitance which is connected thereto does not entail any change in the circuit properties of the amplifier, which would be the case, for example, if ESD protection structures were directly connected to the first and second inputs on account of their capacitive loads. The amplifier paths are connected between an upper reference voltage, for instance an operating voltage VDD, and a lower reference voltage, for instance VSS or ground. However, the reference voltages may also be externally applied using a particular pin.

In another embodiment, a first part of the at least one inductance, which is formed between the connectable node and the first input, has a design that corresponds to that of a second part of the at least one inductance, which is formed between the connectable node and the second input. For example, the two parts can be defined using a center tap which is fitted in the center of an inductance. It is also possible for each part to include one or more inductances, the inductance(s) of both parts having a corresponding layout.

According to another embodiment, the first amplifier path has a first transistor and a second transistor which is complementary to the latter and is connected in series with the latter, the first and second transistors being jointly driven via the first input, and the first output being provided between the first and second transistors which are connected in series, and the second amplifier path has a third transistor and a fourth transistor which is complementary to the latter and is connected in series with the latter, the third and fourth transistors being jointly driven via the second input, and the second output being provided between the third and fourth transistors which are connected in series.

The at least one ESD protection structure may have an anode and a cathode and includes at least one of the elements in the group including a diode, a transistor and a thyristor. If the ESD protection structure is constructed from a transistor, for example, it may be, for instance, a bipolar transistor which is actively driven via its base connection in the case of ESD loading, while the collector and emitter are used as the anode and cathode (or vice versa). It is also possible for the base of the bipolar transistor to be shorted to its emitter or collector, so that two connections, namely the anode and cathode, are available. However, a ggNMOS (grounded gate n-type MOS transistor) whose source and well zone are shorted and whose drain is used as a further connection of the ESD protection structure may also be used, for instance, as a transistor.

In another embodiment, the at least one ESD protection structure is an ESD protection structure whose anode is connected to the connectable node. The cathode of the ESD protection structure is connected to a potential which is above that of the connectable node under operating conditions, for example to a VDD pad.

The at least one ESD protection structure may be an ESD protection structure whose cathode is connected to the connectable node. The anode is connected in such a manner that it is at a lower potential than the connectable node under operating conditions; the anode can be connected to a ground pad, for example.

In another embodiment, the at least one ESD protection structure includes a first ESD protection structure whose cathode is connected to the node and a second ESD protection structure whose anode is connected to the node. This makes it possible to use ESD protection structures in the case of ESD loading to provide current discharge paths both to one or more VDD pads and to one or more ground pads or between VDD pads and ground pads starting from the first or second input.

By way of example, the first and third transistors are in the form of NMOS field effect transistors, and the second and fourth transistors are in the form of PMOS field effect transistors. The first input is connected to the gates of the first and second field effect transistors and the second input is connected to the gates of the third and fourth field effect transistors. The first output is between the drains of the first and second transistors, the drains being directed toward one another, while the second output is between the drains of the third and fourth transistors, the drains being directed toward one another.

The first and third transistors may also be in the form of npn bipolar transistors, and the second and fourth transistors may be in the form of pnp bipolar transistors. In this case, the first input is connected to the bases of the first and second transistors and the second input is connected to the bases of the third and fourth transistors. The collectors of the first and second transistors and those of the third and fourth transistors are also directed toward one another, and the first and second outputs are respectively between the corresponding collectors.

By way of example, the first transistor has the same electrical properties as the third transistor and the second transistor has the same electrical properties as the fourth transistor. To this end, a corresponding transistor layout can be used for the first and third transistors. Accordingly, a corresponding transistor layout can be used for the second and fourth transistors.

In another embodiment, a respective resistor is connected between the first input and the first output and between the second input and the second output. The resistor thus acts as a feedback resistor and is suitable for setting the input matching of the differential amplifier to 50 Ω. In addition, the linearity of the differential amplifier can be improved using the resistor.

According to another embodiment, a capacitance is connected in parallel with the at least one ESD protection structure. This makes it possible to improve the common-mode stability, in particular.

By way of example, the capacitance has a value in the range of 1 pF to 1000 pF. The value of the capacitance can be selected to be as high as possible taking into account the area required for it.

Further transistors for forming cascodes can be connected between the first and second transistors and between the third and fourth transistors. This makes it possible, for example, to reduce the influence of the gate-drain capacitance of the transistor on the gain (Miller effect) and to increase the dielectric strength of the first and second amplifier paths.

A current source may also be connected in series with the first and second amplifier paths. In this case, the current source can be connected, for example, between the amplifier paths and the lower reference potential but it is also possible for the current source to be connected between the upper reference potential, for example the supply voltage, and the amplifier paths. The current source is suitable, for instance, for improving the power supply rejection ratio (PSRR), that is to say the ratio between the interference level of the internally controlled voltage and the interference level of the external supply voltage.

In another embodiment, the first amplifier path has a design that corresponds to that of the second amplifier path and both amplifier paths are connected in a corresponding manner between an upper reference potential and a lower reference potential.

The amplifier may be in the form of a differential amplifier. It may be an LNA (Low Noise Amplifier), for example.

The features described above can be combined with one another as desired.

FIG. 1 illustrates a schematic equivalent circuit diagram of an LNA (Low Noise Amplifier). The latter has a first amplifier path 101 and a second amplifier path 102 which is connected in parallel with the latter. The two amplifier paths 101, 102 are connected to an upper reference potential 104 via a current source 103. They are also likewise connected to a lower reference potential 105.

The first amplifier path 101 has a first n-channel MOS (Metal Oxide Semiconductor) field effect transistor 106 and a second p-channel MOS field effect transistor 107 which is connected in series with the latter. The second transistor 107 is arranged above the first transistor 106 toward the current source 103 in the direction of the upper reference potential 104. The first amplifier stage 101 also has a first input 108 which is used to drive the gate of both the first transistor 106 and the second transistor 107. A first output 109 of the first amplifier path 101 is between the first and second transistors 106 and 107 whose drains are directed toward one another and which are connected in series with one another. A first resistor 110 is connected between the first input 108 and the first output 109. The resistor 110 constitutes a feedback resistor and is used for input matching. In addition, the first resistor 110 improves the linearity of the LNA.

The second amplifier path 102 which is connected in parallel with the first amplifier path 101 has a design that corresponds to that of the first amplifier path 101. In this case, a third transistor 111 in the second amplifier path 102 corresponds to the first transistor 106 in the first amplifier path 101. A fourth transistor 112 in the second amplifier path 102 likewise corresponds to the second transistor 107 in the first amplifier path 101. There is also correspondence to a second resistor 113 which is connected between a second input 114 and a second output 115 of the second amplifier path 102.

An inductance in the form of a coil 116 with a center tap is connected between the first input 108 and the second input 114. Resistors 117, 117' for taking into account resistive losses within the coil 116 are also illustrated. The center tap of the coil 116 constitutes a connectable node 1 18. The connectable node 1 18 is symmetrically located between the first input 108 and the second input 114 in relation to the inductance of the coil 116. The connectable node 118 is thus at AC ground, which is why capacitances which are connected between the connectable node 118 and further reference potentials or pads do not impair the amplifier properties of the LNA.

An ESD protection structure 119 is connected between the connectable node 118 and the lower reference potential 105. In this case, the cathode of the ESD protection structure is connected to the connectable node 118 and the anode of the ESD protection structure is connected to the lower reference potential 105. The ESD protection structure may be ESD elements which are conventional in the semiconductor technology used, such as diodes, transistors or else thyristors. In this case, a capacitance of the ESD protection structure 119 does not impair the circuit properties during amplifier operation. The upper reference potential 104 is provided by a supply voltage, for example, and the lower reference potential corresponds to ground, for example.

Figure 2:
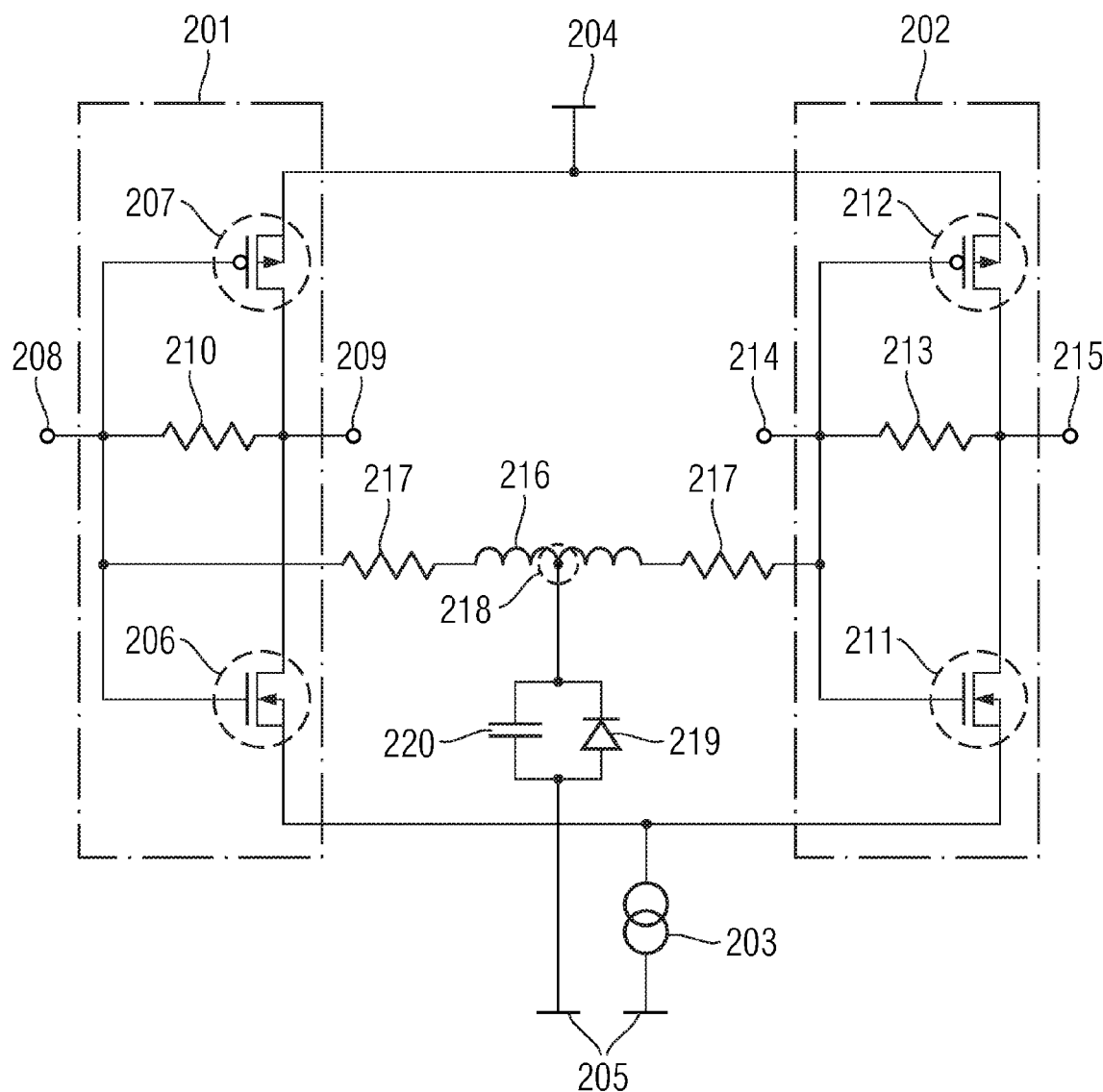
FIG. 2 illustrates a schematic equivalent circuit diagram of an amplifier with ESD protection according to a second embodiment of the invention.

FIG. 2 illustrates a schematic equivalent circuit diagram of an LNA with ESD protection according to a second embodiment of the invention. In this case, the first amplifier path 201, that is to say the first transistor 206, the second transistor 207, the first resistor 210 and the first input 208 and the output 209, corresponds to the corresponding components in the first amplifier path 101 in FIG. 1. The same correspondence is found between the components in the second amplifier path 202 and the corresponding components in the second amplifier path 102 in FIG. 1.

However, in contrast to the LNA of the first embodiment in FIG. 1, the current source 203 of the second embodiment is connected between the lower reference potential 205 and the first and second amplifier paths 201, 202 which are connected in parallel. As in the first embodiment, the coil 216 with a center tap is also connected between the first input 208 and the second input 214 in the second embodiment and its resistive losses are detected using resistors 217, 217'.

However, unlike in the first embodiment, it is not only the cathode of the ESD protection structure 219 which is connected to the connectable node 218 but also a capacitance 220 which is connected in parallel with the ESD protection structure 219. The capacitance may be in the form of a junction capacitance of a pn junction, for example, or else may be formed using a dielectric which exists in the respective underlying technology. The capacitance 220 is suitable, in particular, for common-mode stabilization and is designed to be as large as possible. The capacitance value may be limited, for example, by the amount of area required by the capacitance.

Figure 3:
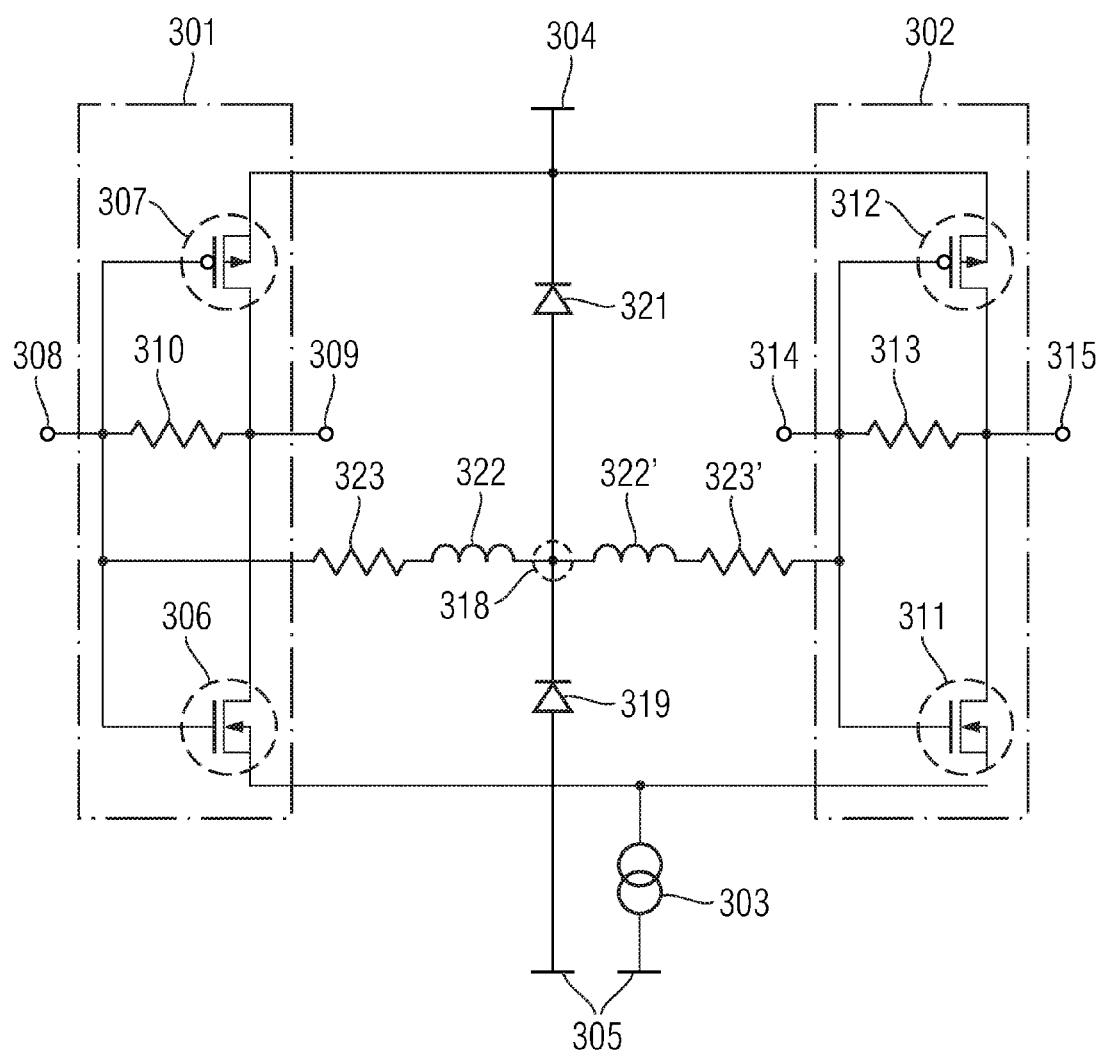
FIG. 3 illustrates a schematic equivalent circuit diagram of an amplifier with ESD protection according to a third embodiment of the invention.

FIG. 3 illustrates a schematic equivalent circuit diagram of an amplifier with ESD protection according to a third embodiment of the invention. In this case, the first amplifier path 301 and the second amplifier path 302 are constructed in a manner corresponding to the first amplifier paths 101, 201 and the second amplifier paths 102, 202 of the first and second embodiments (see FIGS. 1 and 2). Therefore, reference shall be made to the corresponding passages of the description of the figures relating to FIGS. 1 and 2 as regards the structure of the first amplifier path 301 and the second amplifier path 302.

In contrast to the first and second embodiments, the third embodiment does not have an individual coil with a center tap between the first input 308 and the second input 314 but rather two corresponding coils 322, 322' which are connected in series with one another. Resistive losses within the coils 322, 322' are detected using the resistors 323, 323' in the schematic equivalent circuit diagram. The connectable node 318 is symmetrically located between the first input 308 and the second input 314 between the coils 322, 322'.

In a manner corresponding to the first and second embodiments in FIGS. 1 and 2, the cathode of the ESD protection structure 319 is connected to the connectable node 318. The anode of the ESD protection structure 319 is likewise connected to the lower reference potential 305. As in the second embodiment illustrated in FIG. 2, the current source 303 is connected between the lower reference potential 305 and the parallel circuit including the first amplifier path 301 and the second amplifier path 302.

In contrast to the first and second embodiments illustrated in FIGS. 1 and 2, the third embodiment has a further ESD protection structure 321 whose anode is connected to the connectable node 318. The cathode of the further ESD protection structure 321 is connected to the upper reference potential 304.

The amplifier of the third embodiment affords considerable protection in the event of ESD loading by specifying different current discharge paths via a plurality of ESD protection structures. For example, a current discharge path is thus provided, via the further ESD protection structure 321, between a pad which is connected to the upper reference potential 304 and pads which are connected to the inputs 308, 314. A current discharge path is also provided, via the ESD protection structure 319, between the pads which are connected to the inputs 308, 314 and a pad which is connected to the lower reference potential 305, for example a ground pad. As in the previous embodiments as well, the connectable note 318 is connected to AC ground.

Figure 4:
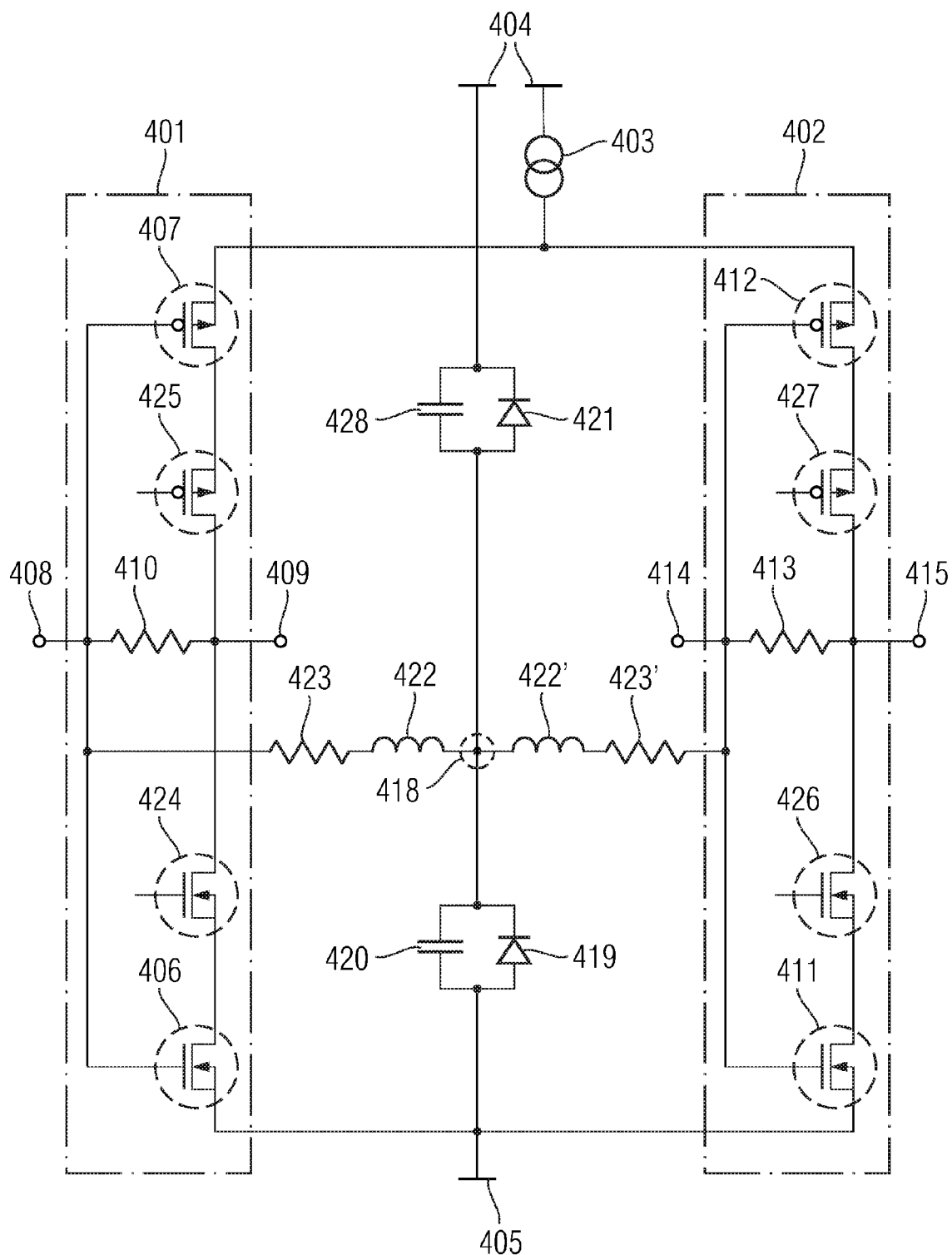
FIG. 4 illustrates a schematic equivalent circuit diagram of an amplifier with ESD protection according to a fourth embodiment of the invention.

FIG. 4 illustrates a schematic equivalent circuit diagram of an amplifier with ESD protection according to a fourth embodiment of the invention. In this case, the first amplifier path 401 and the second amplifier path 402 have been modified in comparison with the first to third embodiments illustrated in FIGS. 1 to 3. The modification concerns, inter alia, further transistors which are connected into the first amplifier path 401 and the second amplifier path 402. A further n-channel MOS field effect transistor is connected as a first cascode transistor 424 above the first n-channel MOS field effect transistor 406 and a further p-channel MOS field effect transistor is connected as a second cascode transistor 425 in series with the further n-channel MOS field effect transistor and below the second p-channel MOS field effect transistor 407. The output 409 is tapped off between the first cascode transistor 424 and the second cascode transistor 425.

The second amplifier path 402 has a design which corresponds to that of the first amplifier path 401 and has a corresponding third cascode transistor 426 and a fourth cascode transistor 427. The gates of the cascode transistors 424, 425, 426, 427 are connected to suitable nodes within the circuit (not illustrated).

In a manner corresponding to the first embodiment shown in FIG. 1, the current source 403 is connected between the upper reference potential 404 and the amplifier paths 401, 402 which are connected in parallel. In a manner corresponding to the third embodiment illustrated in FIG. 3, the ESD protection structure 419 is connected between the connectable node 418 and the lower reference potential 405 and the further ESD protection structure 421 is connected between the upper reference potential 404 and the connectable node 418. However, the capacitance 420 is additionally connected in parallel with the ESD protection structure 419 and a further capacitance 428 is connected in parallel with the further ESD protection structure 421. Both capacitances 420, 428 are used to improve the common-mode stability.

Figure 5:
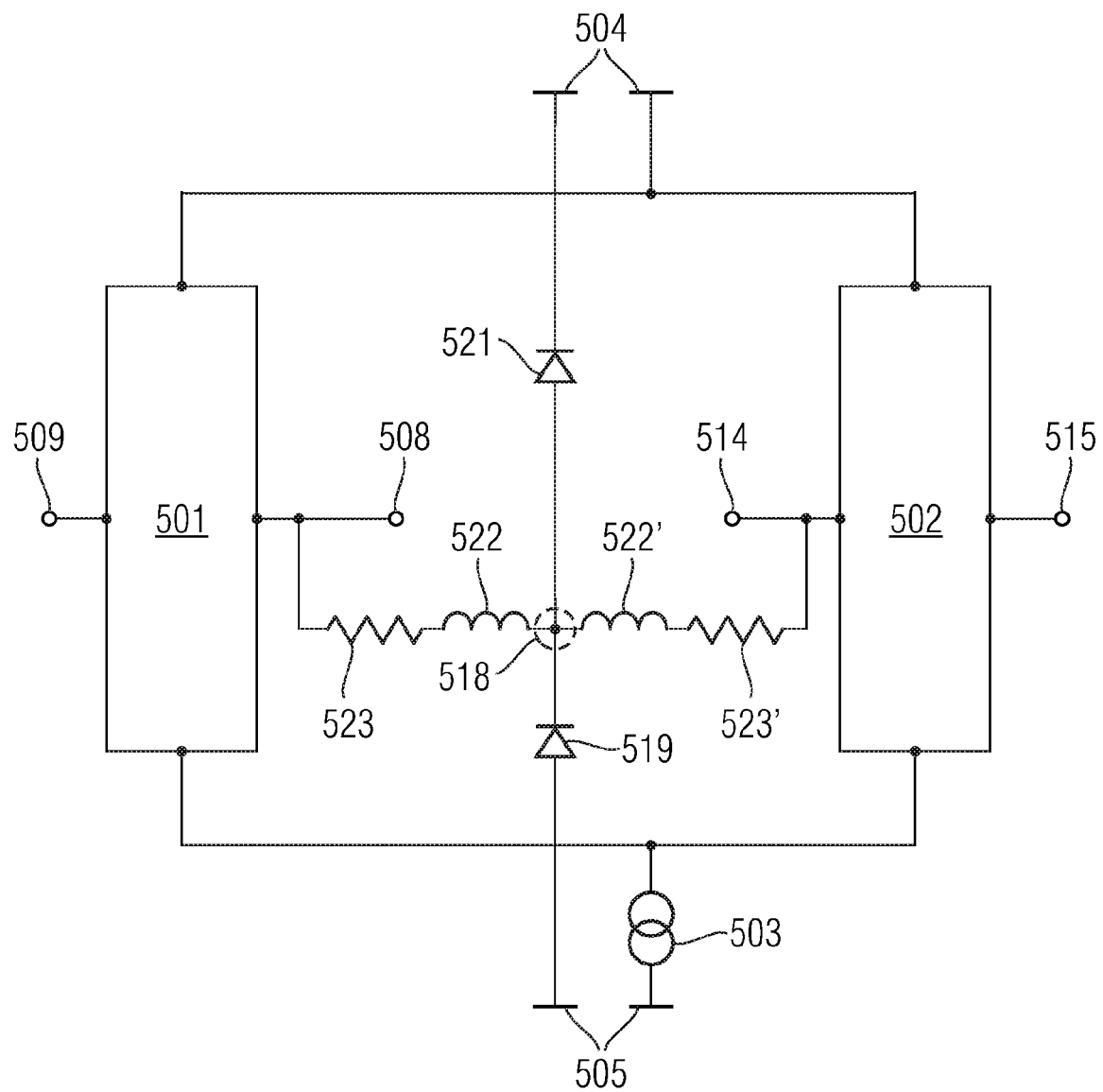
FIG. 5 illustrates a schematic equivalent circuit diagram of an amplifier with ESD protection according to a fifth embodiment of the invention.

FIG. 5 illustrates a schematic equivalent circuit diagram of an amplifier with ESD protection according to a fifth embodiment of the invention. In this case, the first amplifier path 501 is connected to an upper reference potential 504 and is connected to the lower reference potential 505 via the current source 503. The reference potentials 504, 505 are used to supply electrical energy to the first amplifier path 501 in order to amplify a first input signal that is applied to the input 508 of the latter and to output the amplified signal at the first output 509. In a manner corresponding to the first amplifier path 501, the second amplifier path 502 is connected between the upper reference potential 504 and the lower reference potential 505. The second amplifier path 502 has a second input 514 and a second output 515. The design of the first amplifier path 501 corresponds to that of the second amplifier path 502. The connection of the inductances 522, 522' (and their resistors 523, 523') and the ESD protection structures 519, 521 corresponds to that of the corresponding components 322, 322', 323, 323', 419, 521 of the third embodiment illustrated in FIG. 3, which is why the connection is not described any further at this point and instead reference is made to the description relating to FIG. 3.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device having a low-noise amplifier, the low-noise amplifier comprising:
   a first amplifier path with a first input and a first output;
   a second amplifier path with a second input and a second output;
   a coil comprising a first inductive part having a corresponding layout formed between the first input and a connectable node and a second inductive part having a corresponding layout formed between the second input and the connectable node, the connectable node symmetrically arranged along the coil between the first input and the second input; and
   at least one ESD protection structure electrically coupled to the connectable node with no intervening elements there between.

2. The semiconductor device of claim 1, where the connectable node comprises a center tap.

3. The semiconductor device of claim 1, further comprising:
   a first transistor and a second transistor electrically coupled to the first input along the first transistor path.

4. The semiconductor device of claim 3, comprising:
   a third transistor and a fourth transistor electrically coupled to the second input along the second transistor path.

5. The semiconductor device of claim 1, comprising:
   where the semiconductor device is configures as a communications device.

6. The amplifier of claim 1, comprising the amplifier being a differential amplifier.

7. A communications device having a low-noise amplifier, the low-noise amplifier comprising:
   a first amplifier path with a first input and a first output;
   a second amplifier path with a second input and a second output;
   at least one coil comprising a first inductive part having a corresponding layout formed between the first input and a connectable node and a second inductive part have a corresponding layout formed between the second input and the connectable node, the connectable node being symmetrically arranged between the first and second inputs along the at least one coil; and
   at least one ESD protection structure which is connected to the connectable node with no intervening elements there between.

8. The device of claim 7, comprising the first amplifier path having a first transistor and a second transistor which is complementary to the latter and is connected in series with the latter, the first and second transistors being jointly driven via the first input, and the first output being provided between the first and second transistors which are connected in series; and
   the second amplifier path having a third transistor and a fourth transistor which is complementary to the latter and is connected in series with the latter, the third and fourth transistors being jointly driven via the second input, and the second output being provided between the third and fourth transistors which are connected in series.

9. The device of claim 7, comprising the at least one ESD protection structure having an anode and a cathode and comprising at least one of the elements in the group comprising a diode, a transistor and a thyristor.

10. The device of claim 7, comprising the at least one ESD protection structure being an ESD protection structure whose anode is connected to the connectable node.

11. The device of claim 7, comprising the at least one ESD protection structure being an ESD protection structure whose cathode is connected to the connectable node.

12. The device of claim 7, comprising the at least one ESD protection structure comprising a first ESD protection structure whose cathode is connected to the connectable node and a second ESD protection structure whose anode is connected to the connectable node.

13. The device of claim 8, comprising the first and third transistors being in the form of NMOS field effect transistors, and the second and fourth transistors being in the form of PMOS field effect transistors.

14. The device of claim 8, comprising the first and third transistors being in the form of npn bipolar transistors, and the second and fourth transistors being in the form of pnp bipolar transistors.

15. The device of claim 7, comprising a respective resistor being connected between the first input and the first output and between the second input and the second output.

16. The device of claim 7, comprising a capacitance being connected in parallel with the at least one ESD protection structure.

17. The amplifier of claim 16, comprising the capacitance having a value in the range of 1 pF to 1000 pF.

18. The amplifier of claim 7, comprising further transistors for forming cascodes being connected between the first and second transistors and between the third and fourth transistors.

19. The amplifier of claim 7, comprising a current source being connected in series with the first and second amplifier paths.

20. The amplifier of claim 7, comprising the first amplifier path having a design that corresponds to that of the second amplifier path and both amplifier paths being connected in a corresponding manner between an upper reference potential and a lower reference potential.

21. A semiconductor device having a low-noise amplifier, the low-noise amplifier comprising:

- a first amplifier path with a first input and a first output;
- a second amplifier path with a second input and a second output;
- a coil comprising a first inductive part having a corresponding layout between the first input and a connectable node and a second inductive part having a corresponding layout formed between the second input and the connectable node between the first input and the second input; and
- at least one ESD protection structure electrically connected to the connectable node without intervening elements.

* * * * *

UNITED STATES PATENT AND TRADEMARK OFFICE
CERTIFICATE OF CORRECTION

| | | |
|---|---|---|
| PATENT NO. | : 7,835,121 B2 | |
| APPLICATION NO. | : 11/741469 | |
| DATED | : November 16, 2010 | |
| INVENTOR(S) | : Tiebout et al. | |

It is certified that error appears in the above-identified patent and that said Letters Patent is hereby corrected as shown below:

Column 7, line 64, delete "transistor" and insert in place thereof --amplifier--.

Column 7, line 66, delete "configures" and insert in place thereof --configured--.

Signed and Sealed this
Fifth Day of April, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,835,121 B2 | Page 1 of 1 |
| APPLICATION NO. | : 11/741469 | |
| DATED | : November 16, 2010 | |
| INVENTOR(S) | : Tiebout et al. | |

It is certified that error appears in the above-identified patent and that said Letters Patent is hereby corrected as shown below:

Column 7, line 61, delete "transistor" and insert in place thereof --amplifier--.

Signed and Sealed this
Twenty-first Day of June, 2011

David J. Kappos
*Director of the United States Patent and Trademark Office*